(12) United States Patent
Donis

(10) Patent No.: US 7,201,633 B2
(45) Date of Patent: *Apr. 10, 2007

(54) SYSTEMS AND METHODS FOR WAFER POLISHING

(75) Inventor: Robert Wayne Donis, Washougal, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/063,384

(22) Filed: Feb. 22, 2005

(65) Prior Publication Data

US 2006/0189256 A1 Aug. 24, 2006

(51) Int. Cl.
*B24B 7/00* (2006.01)

(52) U.S. Cl. .............................. 451/5; 451/54; 451/285

(58) Field of Classification Search .................. 451/5, 451/8, 36, 41, 54, 285, 287
See application file for complete search history.

(56) References Cited

U.S. PATENT DOCUMENTS

| | | | |
|---|---|---|---|
| 5,449,313 A | 9/1995 | Kordonsky et al. | |
| 6,059,638 A * | 5/2000 | Crevasse et al. | 451/41 |
| 6,146,243 A | 11/2000 | Imahashi | |
| 6,170,149 B1 | 1/2001 | Oshiki et al. | |
| 6,270,397 B1 | 8/2001 | Wu | |
| 6,284,091 B1 | 9/2001 | Wong | |
| 6,435,948 B1 | 8/2002 | Molnar | |
| 6,458,013 B1 | 10/2002 | Saka et al. | |
| 6,589,101 B2 | 7/2003 | Sabde et al. | |
| 6,719,615 B1 | 4/2004 | Molnar | |
| 6,769,969 B1 | 8/2004 | Duescher | |
| 6,899,607 B2 | 5/2005 | Brown | |
| 2003/0134581 A1 | 7/2003 | Wang et al. | |
| 2003/0220053 A1* | 11/2003 | Manens et al. | 451/41 |
| 2004/0005845 A1 | 1/2004 | Kitajima et al. | |
| 2004/0038625 A1* | 2/2004 | Chandrasekaran | 451/11 |
| 2004/0137829 A1 | 7/2004 | Park et al. | |
| 2004/0142635 A1 | 7/2004 | Elledge | |
| 2004/0198200 A1* | 10/2004 | Lee | 451/287 |
| 2005/0255792 A1 | 11/2005 | Elledge | |

OTHER PUBLICATIONS

U.S. Appl. No. 11/158,450, filed Jun. 21, 2005; First Non-Final Office Action, PTO Date Mailed Feb. 15, 2006.

* cited by examiner

Primary Examiner—Jacob K. Ackun, Jr.
(74) Attorney, Agent, or Firm—North Weber & Baugh LLP

(57) ABSTRACT

An electromagnetic polish head (100) comprises at least one electromagnet. An embodiment may also include the addition of a slurry component or components that can be affected by an electromagnetic field. During polishing or planarization, a field or fields may be generated by the polish head (100) to affect the polishing of a wafer by attracting or repelling the slurry to a portion or portions of the substrate.

16 Claims, 6 Drawing Sheets

SYSTEMS AND METHODS FOR WAFER POLISHING

CROSS-REFERENCE TO RELATED APPLICATIONS

This patent application is related to commonly-assigned U.S. patent application Ser. No. 11/158,450, filed Jun. 21, 2005, entitled "Systems and Methods for Wafer Polishing."

BACKGROUND

A. Technical Field

The present invention relates generally to the field of semiconductor wafer fabrication, and more particularly, to chemical mechanical planarization or polishing (CMP) of wafers.

B. Background of the Invention

The manufacturing of semiconductor devices, including integrated circuits, microchips, or chips, often involves multiple processes. For example, a semiconductor device may comprise a substrate on which a number of films of various chemical compositions are layered. During manufacturing, a layer's thickness or uniformity may need to be within a set limit for the final device to function properly. Thus, at one or more times during the manufacturing of a semiconductor device, the wafer under development may need to be planarized. One method for planarizing substrates utilized in semiconductor manufacturing is called chemical mechanical polishing or planarization. Chemical mechanical polishing or planarization (CMP) is a polishing process that uses a combination of mechanical removal and chemical etching to planarize a wafer's surface.

A typical CMP apparatus comprises a polish head (also referred to as a carrier head) and a polishing pad. The polish head is a tool fixture that holds a wafer during the CMP process. Typically, the wafer is held in place, in an inverted position, against the polish head through vacuum pressure. A polishing pad faces the wafer when the wafer is positioned on the polish head. During a CMP process, the polish head presses the wafer against the polishing pad. Depending on the particular CMP apparatus configuration, both the polishing pad and the polish head may rotate to create the mechanical polishing. Typically, a chemical etching solution is continuously pumped onto the polishing pad during the CMP process.

The chemical etching solution, also referred to as the "slurry," is normally a mixture of an abrasive or abrasives and other chemicals. For example, a slurry may contain silica or alumina particles dispersed and suspended in an acidic or a basic etching solution, depending on the application.

CMP processes are normally used to planarize silicon wafers at both post-ingot wafer slicing and at various levels of the chip development. For example, once the bare silicon wafer is cut from the silicon ingot, its surface is usually rough and uneven. Generally, there are strict tolerances as to the planarity of the wafer before it can be used to produce yielding chips. To achieve an acceptable level of planarity, CMP is typically employed to planarize the wafer.

Also, during the production of an integrated circuit, it is typically very desirable that the wafer's surface be planar throughout each process. However, due to the nature of certain processes, a non-planar surface may be produced. This non-planar surface may lead to various problems in production, which generally leads to a reduced yield of functional chips. For example, due to uneven topography of the wafer, possibly resulting from prior deposition cycles or other manufacturing processes, reactants may grow uneven layers onto the surface of the wafer. Once again, CMP is often used to reduce the wafer's altitude variations so that subsequent process steps can be performed.

Although the use of CMP processing during the manufacturing of semiconductor manufacturing helps increase yield, the CMP process has limits. Currently, the CMP process may not be able to planarize sufficiently a wafer that possesses too great a disparity in wafer surface altitude. Furthermore, current CMP process may introduce defects into wafers by over-polishing or under-polishing certain areas. These problems may lead to decreased yields of semiconductor products.

SUMMARY OF THE INVENTION

In general, exemplary embodiments of the invention are concerned with an electromagnetic polish head comprises at least one electromagnet. An embodiment may also include employing a slurry component or components that can be affected by an electromagnetic field, such as, for example, a polarized or polarizable slurry component or components. In one embodiment, during polishing or planarization, a field or fields may be generated by the polish head to affect the polishing of a wafer by attracting or repelling the slurry component or components to a portion or portions of the substrate. In an embodiment, the field or fields generated by an electromagnetic polish head may be varied during the polishing process. An embodiment of the present invention may include a controller, computer system, or processing unit to monitor and/or control the fields generated by the electromagnetic polish head.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be performed in a variety of ways and using a variety of means, including software, hardware, firmware, or a combination thereof. Accordingly, the embodiments described below are illustrative of specific embodiments of the invention and are meant to avoid obscuring the invention.

Reference in the specification to "one embodiment," "a preferred embodiment," or "an embodiment" means that a particular feature, structure, characteristic, or function described in connection with the embodiment is included in at least one embodiment of the invention. The appearances of the phrase "in one embodiment," "in an embodiment," or the like in various places in the specification are not necessarily all referring to the same embodiment.

Figure 1:
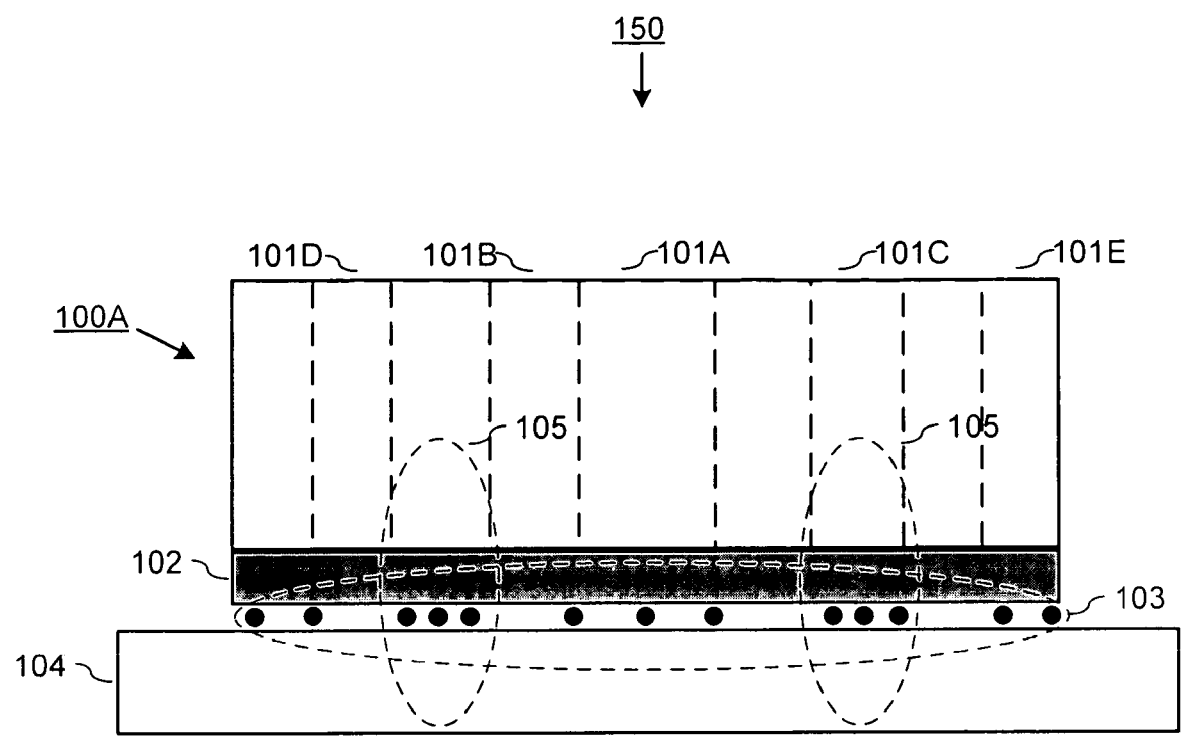
FIG. 1 illustrates a partial profile of a chemical mechanical polishing apparatus, including an embodiment of an electromagnetic polish head and slurry.

FIG. 1 is a cross-sectional view of part of a chemical mechanical polishing apparatus 150 with an embodiment of an electromagnetic polishing head 100A holding a wafer substrate 102. According to the present invention, electromagnetic polishing head 100A possesses one or more zones 101 capable of inducing an electromagnetic field. In the embodiment depicted in FIG. 1, polishing head 100A possess five zones, 101A–101E, which are each capable of generating electromagnetic fields.

In FIG. 1, slurry 103 containing the chemicals for a CMP process is introduced onto a polishing pad 104. Slurry 103 may also contain one or more polarized or polarizable chemicals capable of being affected by an electromagnetic field. For example, slurry 103 may contain an iron component, such as, for example, ferric oxide or iron. As depicted in FIG. 1, slurry 103 has a general concentration over the surface of the polishing pad 104 and wafer 102. As further illustrated, a higher concentration 105 of the slurry exists under zone 101C. The higher concentration under zone 101C is a result of an electromagnetic field being generated in zone 101C. Accordingly, electromagnetic polish head 100A has the ability to affect the distribution of the slurry 103 in contact with wafer 102.

Because slurry component or components may be drawn to or repelled from a region, the present invention provides greater control over a CMP process. The present invention may provide for more or less polishing on portions of a wafer by attracting or repelling slurry to a particular portion of a wafer, depending upon the polarizations of the slurry and the electromagnetic field or fields. By controlling the polishing rates at different locations on the wafer, the present invention may be employed to create a desired profile on a wafer. Furthermore, wafers that previously may have possessed surface variations too severe for a CMP process to correct may, through application of the present invention, be planarized. Accordingly, greater outputs in yield may be achieved.

Figure 2:
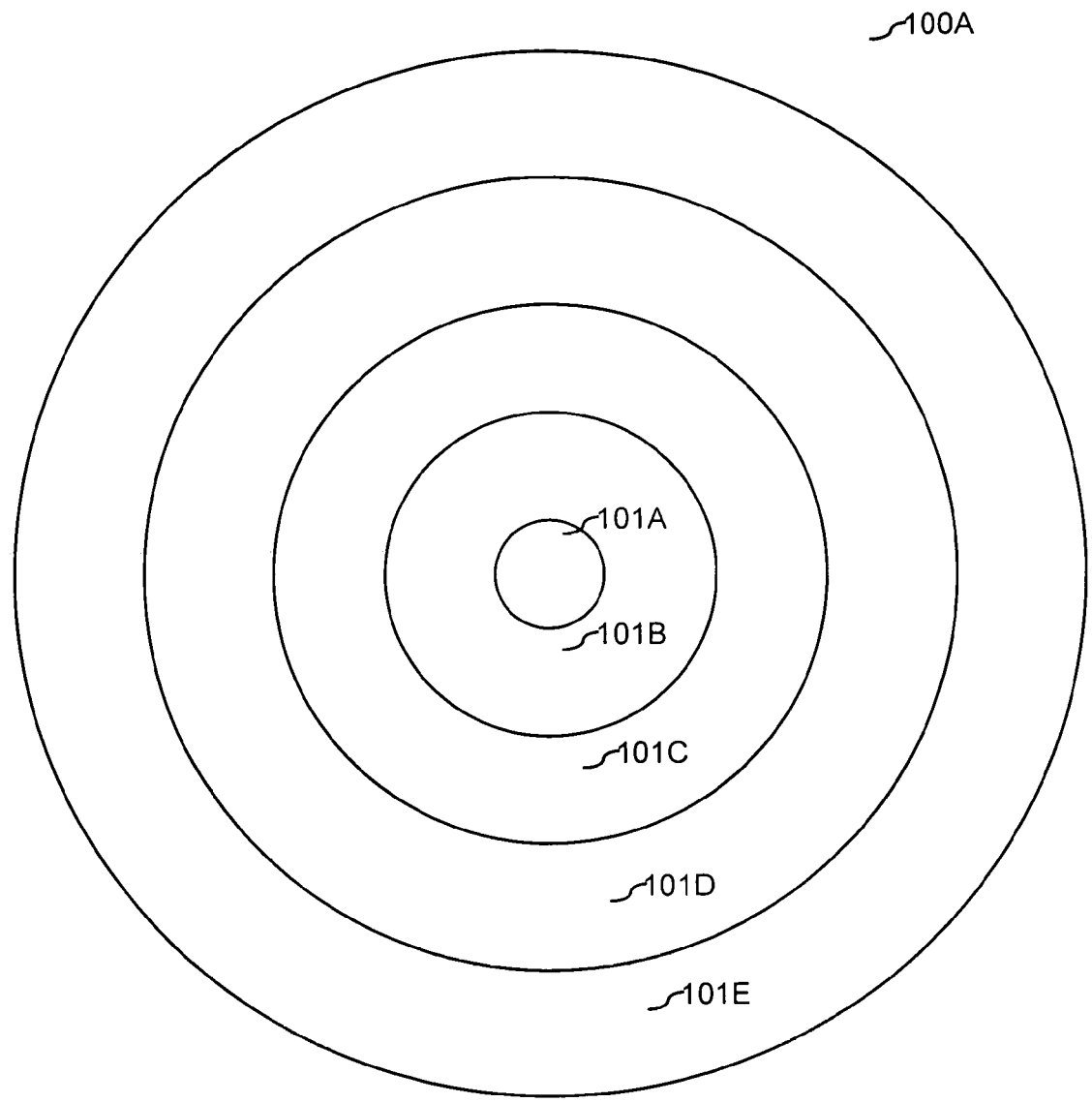
FIG. 2 is a top view of the embodiment of the electromagnetic polish head depicted in FIG. 1.

FIG. 2 depicts the top view of the electromagnetic polish head 100A illustrated in FIG. 1. Electromagnetic polish head 100A comprises a plurality of distinct zones or regions. In the embodiment depicted in FIG. 2, polish head 100A is comprised of five concentric zones 101A–101E. Each zone 101A–E may be electrically isolated and thus may be capable of generating its own electromagnetic field. It should be noted that the present invention is not limited to concentric zones as depicted in FIGS. 1 and 2. Any of a number of patterns of electromagnets or electromagnetic zone configurations may be utilized in polish head 100.

Figure 3:
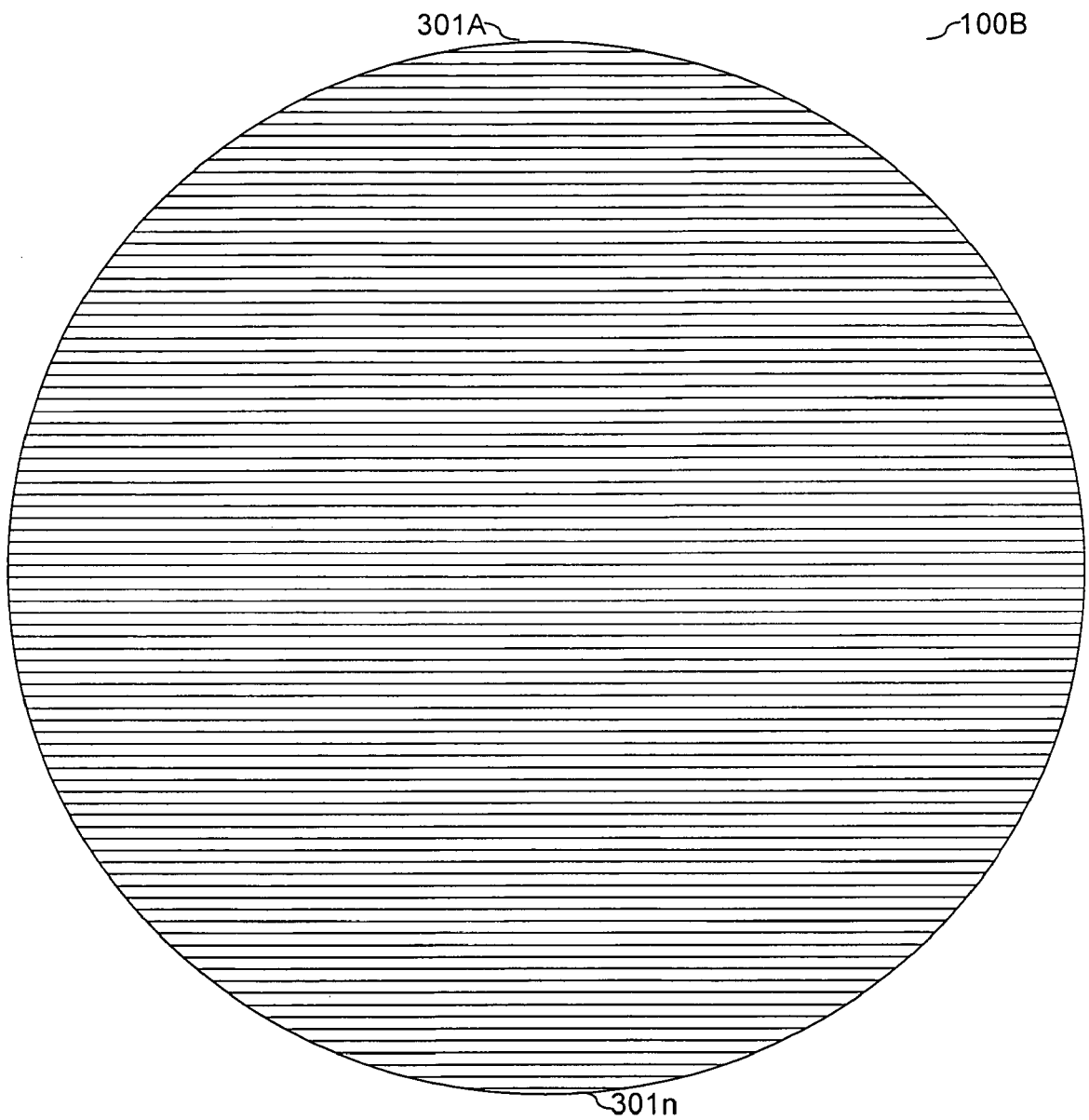
FIG. 3 is a top view of an alternate embodiment of an electromagnetic polish head.

For example, FIG. 3 depicts an alternate embodiment of an electromagnetic polish head. Polish head 100B possesses a plurality of parallel or substantially parallel zones 301A–301n. Each of zones 301A–301n may possess one or more electromagnets capable of generating a magnetic field. In the embodiment depicted in FIG. 3, polish head 100B may be configured with a number of zones varying from 2 to n.

Figure 4:
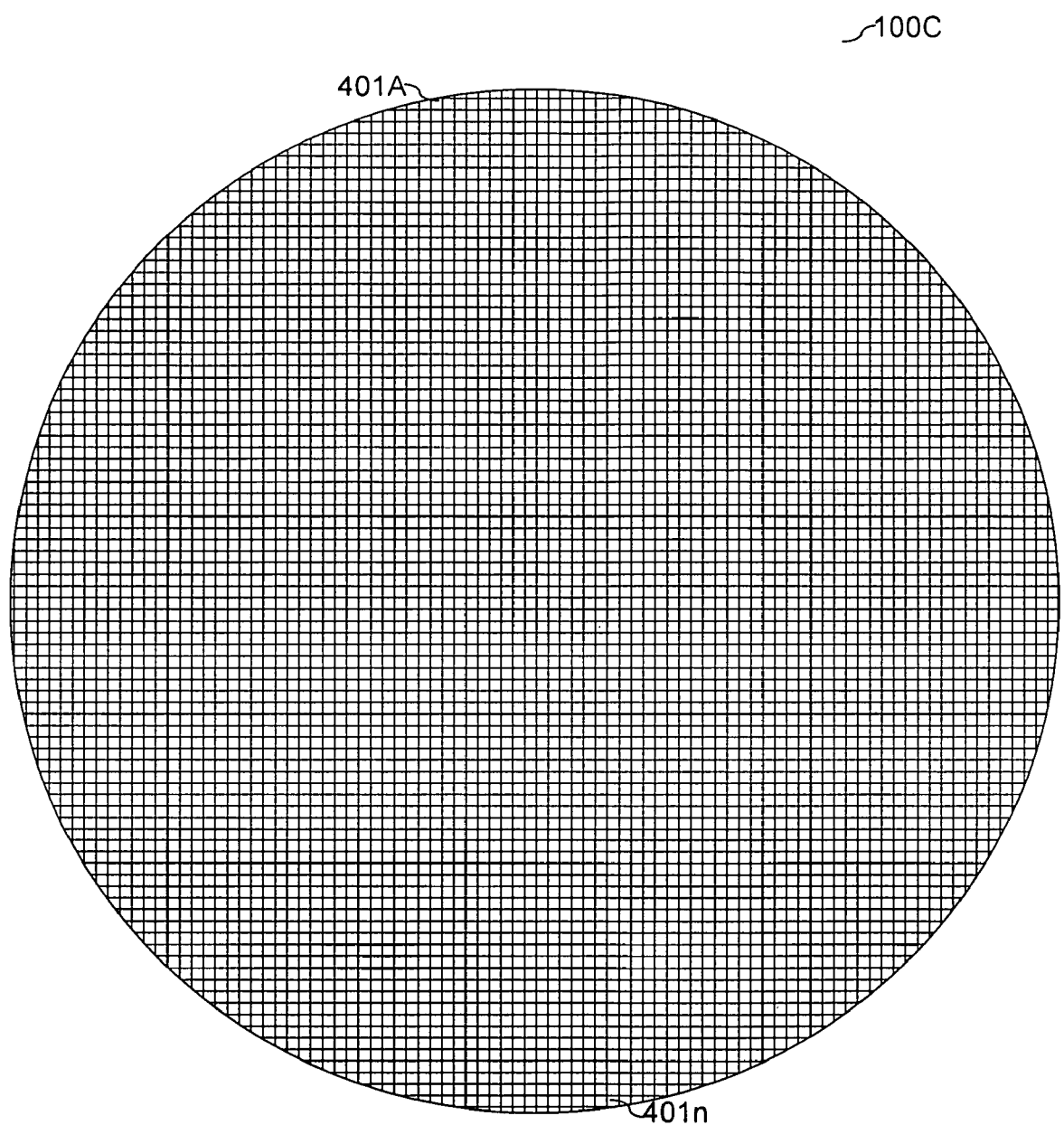
FIG. 4 is a top view of an alternate embodiment of an electromagnetic polish head.

FIG. 4 depicts yet another embodiment of an electromagnetic polish head. Polish head 100C possesses a plurality of small zones 401A–401n. Each of zones 401A–401n may possess one or more electromagnets capable of generating an electromagnetic field. In the embodiment depicted in FIG. 4, polish head 100C may be configured with a number of zones varying from 2 to n. The small zones 401A–401n increase the ability to direct slurry chemicals to smaller regions on a wafer. It should be understood with this embodiment, as with each of the embodiments, that the different zones 401A–401n of polish head 100C may be the same size or may be different sizes.

Figure 5:
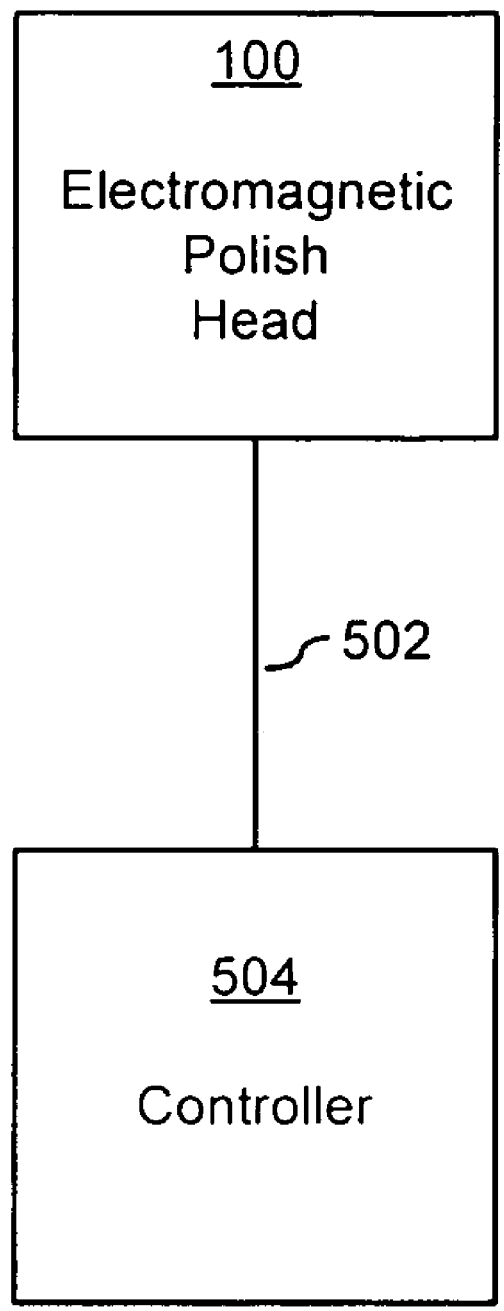
FIG. 5 is a block diagram of an alternate embodiment of an electromagnetic polish head system.

FIG. 5 depicts a block diagram of an embodiment of a system comprising an electromagnetic polish head 100 and a controller 504. As depicted in FIG. 5, electromagnetic polish head 100 is functionally connected via connection 502 to a controller 504. One skilled in the art will recognize that controller 504 may be any of a number of devices or combination of devices known for controlling electromagnets, controlling voltages, or controlling current flows. Furthermore, controller 504 may be implemented in hardware, software, firmware, or any combination thereof.

In one embodiment, electromagnetic polish head 100 may be electrically coupled to an alternating current for energizing an electromagnetic field or zones. In an embodiment, controller 504 may comprise a processor or computer system that controls the magnitude and polarity of the electromagnetic fields generated by the different zones of polish head 100.

In an embodiment, a processor may receive profile information to determine the desired electromagnetic field strength and polarity needed to produce the desired wafer profile. A desired slurry/electromagnetic profile may be determined and applied during the CMP process in a number of ways. For example, sample wafers may be inspected to determine the profile resulting from the manufacturing process. In an alternate embodiment, the desired profile may be determined given the known wafer geographies and/or previous manufacturing processes. In another embodiment, the wafer, itself, may be examined to determine its specific profile.

One skilled in the art will recognize that the electromagnetic fields generated by the electromagnets need not be held constant during the entire CMP process. Rather, the fields may be changed during the process to adjust the rates of polishing during the CMP process. It should also be noted that although each zone is capable of generating an electromagnetic field of different magnitude and polarity than the other zones, two or more zones may be set to generate electromagnetic fields of the same magnitude and polarity.

Figure 6:
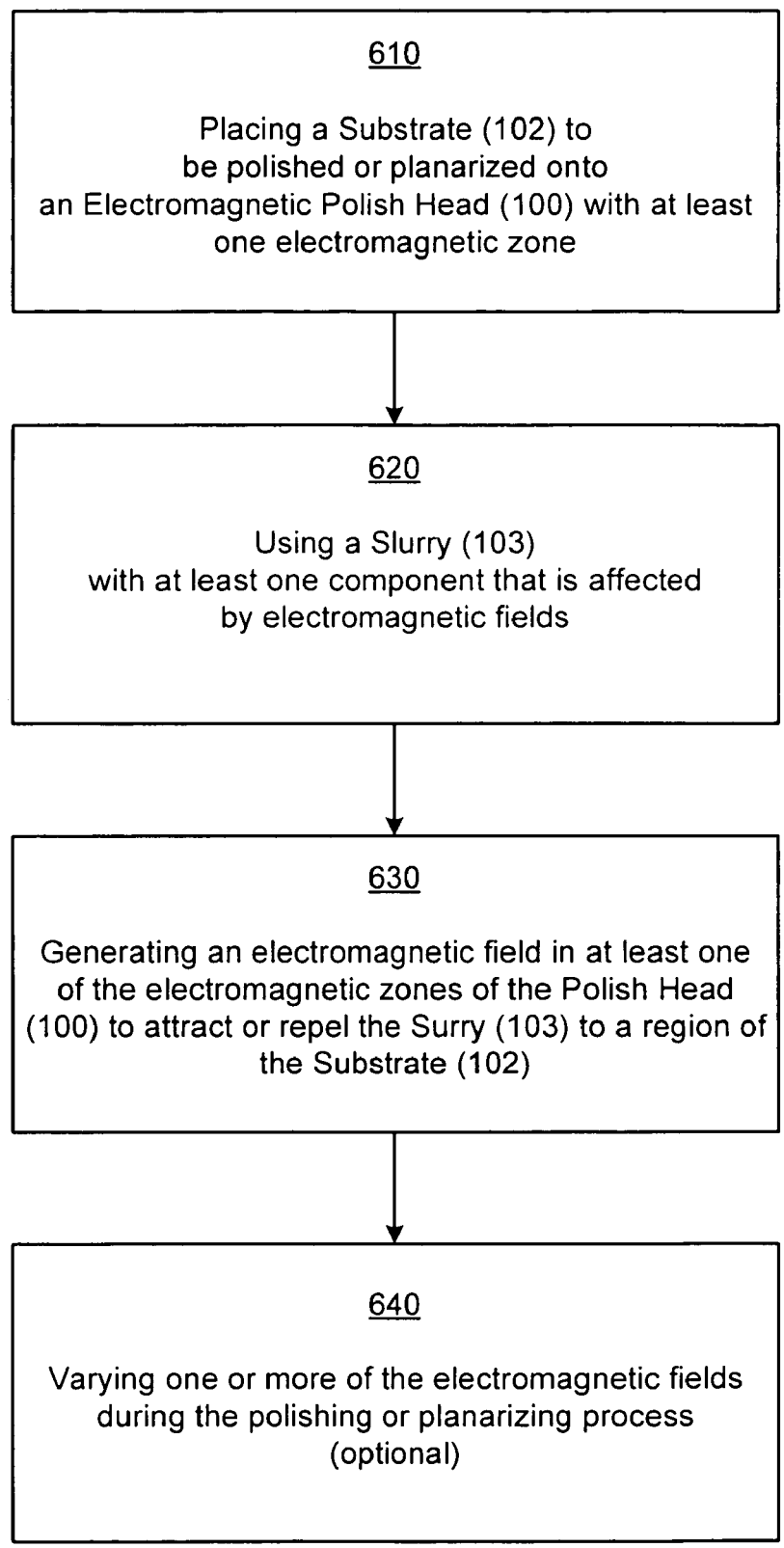
FIG. 6 is a flow chart illustrating an embodiment of a method for utilizing an electromagnetic polish head and slurry to control the polishing or planarization of a substrate.

FIG. 6 depicts a flow chart illustrating an embodiment of a method according to the present invention. A wafer or substrate is placed 610 onto an embodiment of an electromagnetic polish head 100. Electromagnetic polish head 100 may possess one or more electromagnets for generating electromagnetic fields. A slurry 103 with at least one component that is affected by an electromagnetic field is applied 620 between the polishing pad 104 and the substrate 102. At least one electromagnetic field may be generated 630 in at least one zone in the polish head 100 to attract or repel the slurry 103 to a portion of the substrate 102. Due to the attraction or repulsion of the slurry by the electromagnetic polish head 100, slurry 130 may mechanically and/or chemically polish more or less of a portion of the wafer.

In an embodiment, two or more electromagnetic fields may be generated. It should be noted that these fields may be generated at the same time or at different times during the CMP process. In another embodiment, one or more of the field's magnitude and/or polarity may be varied or adjusted 640 during the CMP process. Accordingly, the CMP process may be adjusted to customize the distribution of the slurry to match the changing wafer profile.

The above description is included to illustrate embodiments of the present invention and is not meant to limit the scope of the invention. The scope of the invention is to be limited only by the following claims. From the above discussion, many variations will be apparent to one skilled in the art that would yet be encompassed by the spirit and scope of the present invention.

I claim:

1. A chemical mechanical polishing system for polishing a substrate comprising:
    a slurry with at least one component capable of being affected by an electromagnetic field;
    a polish head comprising at least one electromagnet for generating an electromagnetic field to affect the slurry's distribution across at least a portion of the substrate's surface while polishing with a polish pad, wherein the electromagnetic field affects a rate of polishing on at least a portion of the substrate by attracting slurry to said at least a portion of the substrate; and
    a controller for controlling the electromagnetic field generated by the electromagnet.

2. The system of claim 1 wherein the controller obtains a substrate profile to determine an electromagnetic field profile.

3. The system of claim 2 wherein the substrate profile is determined from a sample substrate.

4. The system of claim 1 wherein the controller varies the electromagnetic field during a polishing process.

5. The system of claim 1 wherein the slurry contains an iron component.

6. A chemical mechanical polishing system for polishing a substrate comprising:
    a slurry with at least one component capable of being affected by an electromagnetic field;
    a polish head comprising at least one electromagnet for generating an electromagnetic field to affect the slurry's distribution across at least a portion of the substrate's surface while polishing with a polish pad, wherein the electromagnetic field affects a rate of polishing on at least a portion of the substrate by repelling slurry from said at least a portion of the substrate; and
    a controller for controlling the electromagnetic field generated by the electromagnet.

7. The system of claim 6 wherein the controller obtains a substrate profile to determine an electromagnetic field profile.

8. The system of claim 7 wherein the substrate profile is determined from a sample substrate.

9. The system of claim 6 wherein the controller varies the electromagnetic field during a polishing process.

10. The system of claim 6 wherein the slurry contains an iron component.

11. A method for affecting the polishing rate on at least a portion of a substrate comprising:
    using a slurry with at least one component capable of being affected by a electromagnetic field;
    placing the substrate on a polish head comprising an electromagnet; and
    using the electromagnet to generate an electromagnetic field to affect the slurry's distribution across at least a portion of the substrate's surface while polishing with a polish pad.

12. The method of claim 11 further comprising the step of varying the electromagnetic field generated by the electromagnet during polishing.

13. The method of claim 11 further comprising the step of obtaining a substrate profile to determine the electromagnetic field profile.

14. The method of claim 13 wherein the substrate profile is determined from a sample substrate.

15. The method of claim 11 wherein the slurry comprises an iron component.

16. The method of claim 11 further comprising the step of generating at least two electromagnetic fields.

* * * * *